United States Patent
Lee et al.

(10) Patent No.: US 10,340,316 B2
(45) Date of Patent: Jul. 2, 2019

(54) DISPLAY DEVICE UTILIZING PIXEL AND DUMMY PORTIONS

(71) Applicant: Samsung Display Co., Ltd., Yongin-si, Gyeonggi-do (KR)

(72) Inventors: Ung Soo Lee, Yongin-si (KR); Ho Youn Kim, Yongin-si (KR); Jin Woo Park, Yongin-si (KR); Hyun Chul Oh, Yongin-si (KR); Jun Young Lee, Yongin-si (KR); Hyun Soo Jung, Yongin-si (KR); Su Hyuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/263,226

(22) Filed: Sep. 12, 2016

(65) Prior Publication Data
US 2017/0221970 A1    Aug. 3, 2017

(30) Foreign Application Priority Data

Feb. 3, 2016    (KR) .................. 10-2016-0013550

(51) Int. Cl.
*H01L 23/31* (2006.01)
*H01L 27/32* (2006.01)
(Continued)

(52) U.S. Cl.
CPC ...... *H01L 27/323* (2013.01); *G02F 1/133351* (2013.01); *G06F 3/041* (2013.01);
(Continued)

(58) Field of Classification Search
CPC ............ H01L 23/3142; H01L 23/3223; H01L 27/323; H01L 51/0024; H01L 51/524; H01L 51/5243; H01L 51/5246
See application file for complete search history.

(56) References Cited

U.S. PATENT DOCUMENTS

| 7,791,267 B2 | 9/2010 | Baek et al. |
| 2007/0177069 A1 | 8/2007 | Lee |

(Continued)

FOREIGN PATENT DOCUMENTS

| JP | 2013-16371 A | 1/2013 |
| KR | 10-2013-0020076 | 2/2013 |

OTHER PUBLICATIONS

EPO Extended Search Report dated Jun. 30, 2017, for corresponding European Patent Application No. 16204894.6 (10 pages).
(Continued)

*Primary Examiner* — Hoai V Pham
(74) *Attorney, Agent, or Firm* — Lewis Roca Rothgerber Christie LLP

(57) ABSTRACT

A display device includes a first substrate, a second substrate comprising a pixel portion configured to display an image, and a dummy portion spaced from the pixel portion, a side of the dummy portion being exposed to the outside, and an interlayer between the first substrate and the second substrate, wherein the pixel portion and the dummy portion each include multiple layers, and at least one layer of the pixel portion and at least one layer of the dummy portion include a same material.

19 Claims, 10 Drawing Sheets

(51) Int. Cl.
    *H01L 51/52*          (2006.01)
    *H01L 51/56*          (2006.01)
    *H01L 51/00*          (2006.01)
    *G06F 3/041*          (2006.01)
    *G02F 1/1333*        (2006.01)

(52) U.S. Cl.
    CPC ...... *H01L 27/3223* (2013.01); *H01L 27/3262* (2013.01); *H01L 27/3265* (2013.01); *H01L 27/3276* (2013.01); *H01L 51/0024* (2013.01); *H01L 51/5256* (2013.01); *H01L 51/56* (2013.01); *H01L 2227/323* (2013.01); *H01L 2251/566* (2013.01)

(56) References Cited

U.S. PATENT DOCUMENTS

| | | | |
|---|---|---|---|
| 2014/0175972 A1* | 6/2014 | Lee | H05B 33/04 |
| | | | 313/512 |
| 2015/0093845 A1 | 4/2015 | Ookawara et al. | |
| 2015/0179720 A1 | 6/2015 | Go et al. | |
| 2017/0023979 A1* | 1/2017 | Yamazaki | G06F 1/1652 |

OTHER PUBLICATIONS

European Examination Report for Application No. 16 204 894.6, dated Jul. 4, 2018, 6 pages.

* cited by examiner

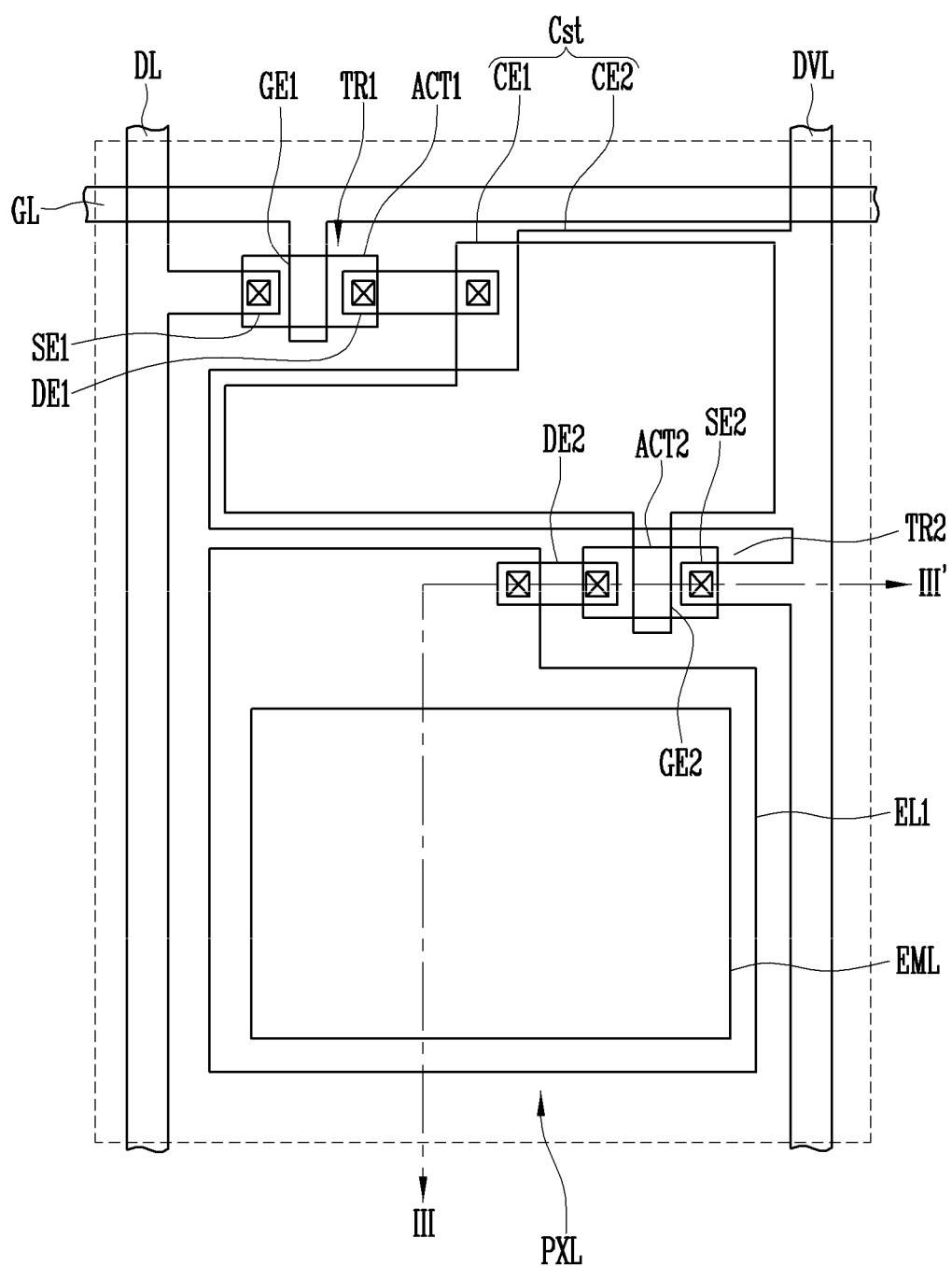

DISPLAY DEVICE UTILIZING PIXEL AND DUMMY PORTIONS

CROSS-REFERENCE TO RELATED APPLICATION

This application claims priority to and the benefit of Korean Patent Application No. 10-2016-0013550, filed on Feb. 3, 2016, in the Korean Intellectual Property Office, the entire content of which is incorporated herein by reference in its entirety.

BACKGROUND

1. Field

Aspects of embodiments of the present disclosure relate to a display device and a method for manufacturing the display device.

2. Description of the Related Art

Today's display devices are equipped with a touch recognition function, for recognizing a touch of a user, together with an image display function. Such a display device does not need an additional input device such as a keyboard, a mouse and/or the like, and thus it is used in an increasing number of areas.

Conventional display devices can be manufactured by preparing a display panel and a touch panel separately, and then attaching the touch panel to the display panel.

Such a method, however, employs separate processes for manufacturing the touch panel and the display panel, which is inefficient in terms of processing time and processing cost. Therefore, it is desirable to integrate the touch panel with the display panel.

SUMMARY

Aspects of the present disclosure are directed to a display device that includes a touch sensor and that has reduced defect rates.

Aspects of the present disclosure are directed to a method for manufacturing a display device that includes a touch sensor and that has reduced defect rates.

According to an embodiment of the present disclosure, there is provided a display device including: a first substrate; a second substrate comprising a pixel portion configured to display an image, and a dummy portion spaced from the pixel portion, a side of the dummy portion being exposed to the outside; and an interlayer between the first substrate and the second substrate, wherein the pixel portion and the dummy portion each include multiple layers, and at least one layer of the pixel portion and at least one layer of the dummy portion include a same material.

In an embodiment, a portion of an edge of the second substrate and a portion of an edge of the dummy portion are aligned in a plan view.

In an embodiment, the display device has a circular, an oval, or a polygonal shape, and the dummy portion is arranged along at least a portion of lines of the circular, the oval, or the polygonal shape.

In an embodiment, a portion of a side of the interlayer is exposed to the outside.

In an embodiment, the pixel portion includes at least one pixel, and a sealing layer on the pixel to cover the pixel.

In an embodiment, the dummy portion includes a dummy sealing layer that includes a same material as the sealing layer.

In an embodiment, the sealing layer includes multiple layers including an organic insulating layer and an inorganic insulating layer.

In an embodiment, at least one of the organic insulating layer and the inorganic insulating layer are provided in plural, and the organic and inorganic insulating layers are arranged alternately to each other.

In an embodiment, the pixel includes multiple layers, and the dummy portion includes a same material as at least one of the multiple layers of the pixel.

In an embodiment, the display device includes a display area configured to display the image and a non-display area at a periphery of the display area, and the pixel portion is at the display area.

In an embodiment, the dummy portion is at the non-display area, and is spaced from the pixel portion.

In an embodiment, the dummy portion covers the display area in a plan view.

In an embodiment, the dummy portion covers a portion of the display area in a plan view.

In an embodiment, the dummy portion includes a plurality of bars extending along a circumference of the first substrate.

In an embodiment, the second substrate includes a second base substrate on which the pixel portion and the dummy portion are formed, and the interlayer is filled between the dummy portion and the pixel portion.

In an embodiment, the display device further includes a touch sensor between the first substrate and the interlayer.

According to an embodiment of the present disclosure, there is provided a display device including: a first substrate; a second substrate including a pixel portion configured to display an image, and a dummy portion spaced from the pixel portion; and an interlayer between the first substrate and the second substrate, wherein the pixel portion and the dummy portion each include multiple layers, and at least a portion of the pixel portion and at least a portion of the dummy portion are formed by a same process.

According to an embodiment of the present disclosure, there is provided a method for manufacturing a display device, the method including: preparing a first mother substrate; preparing a second mother substrate having a plurality of unit areas divided by an imaginary line; forming a pixel portion at the unit areas; forming a dummy portion along the imaginary line; bonding the first mother substrate and the second mother substrate with an interlayer between the first mother substrate and the second mother substrate; and cutting the first mother substrate and the second mother substrate along the imaginary line, wherein at least a portion of the pixel portion and at least a portion of the dummy portion are formed by a same process.

In an embodiment, the imaginary line is at the dummy portion in a plan view.

In an embodiment, the first mother substrate includes a display area where the pixel portion is formed and a non-display area, and the dummy portion is at the non-display area.

In an embodiment, the forming a pixel portion includes: forming a pixel on the first mother substrate; and forming a sealing layer on the pixel, wherein at least a portion of the dummy portion is formed at a same step as the sealing layer.

In an embodiment, the pixel is formed as multiple layers, and at least a portion of the dummy portion is formed at a same step as the pixel.

In an embodiment, the method further included forming a touch sensor on the first mother substrate.

In an embodiment, the cutting is performed using laser.

According to the aforementioned embodiments of the present disclosure, it is possible to provide a display device of which the defect rate is reduced by a dummy portion provided in a non-display area, and a method for manufacturing the display device.

BRIEF DESCRIPTION OF THE DRAWINGS

Example embodiments will now be described more fully hereinafter with reference to the accompanying drawings, wherein:

FIG. 5A is a plan view illustrating a part of a pixel portion;

DETAILED DESCRIPTION

Figure 1:
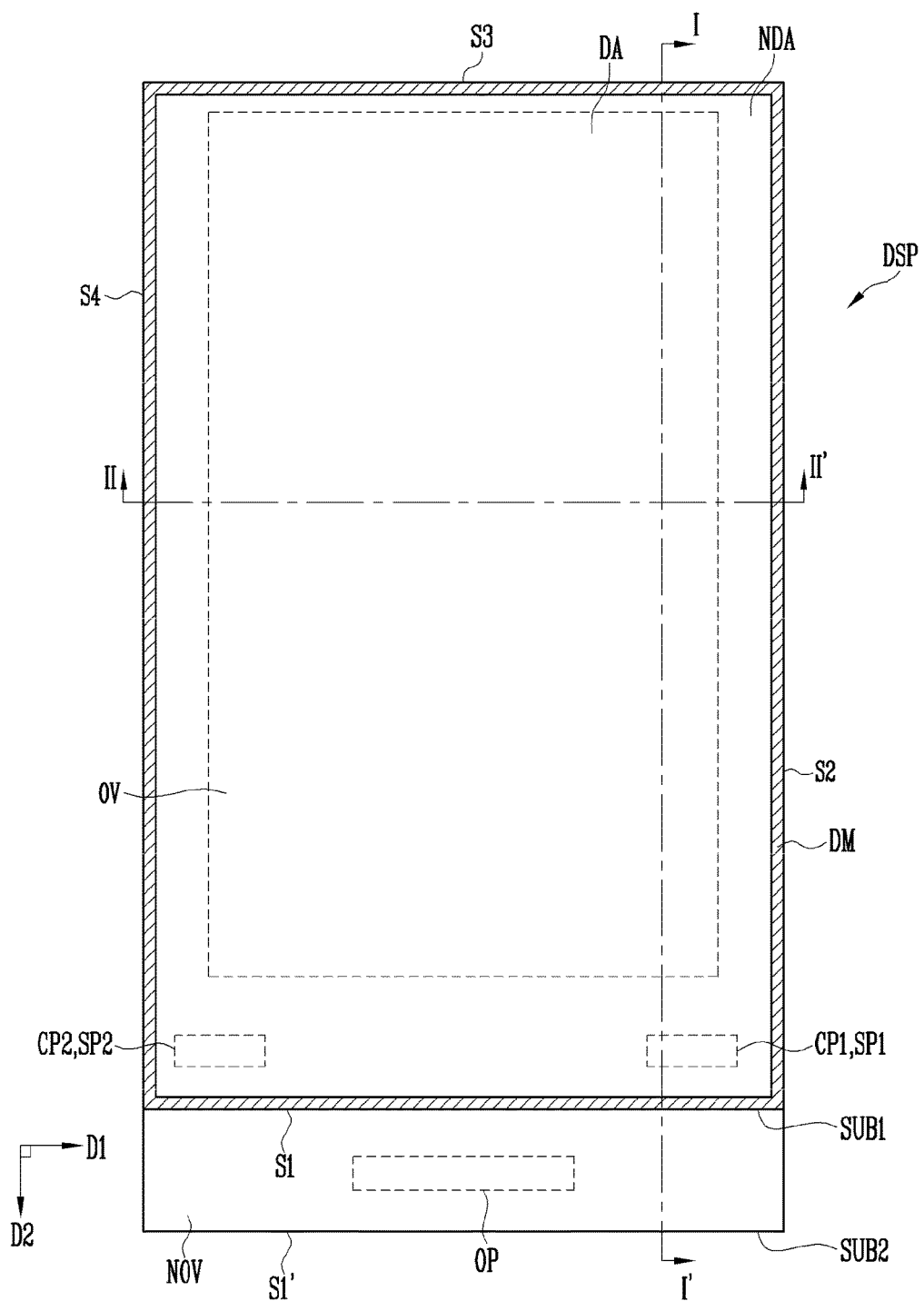
FIG. 1 is a plan view illustrating a display device according to an embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary, to those having ordinary skill in the art, for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be explained in more detail with reference to the drawings attached.

Figure 2A:
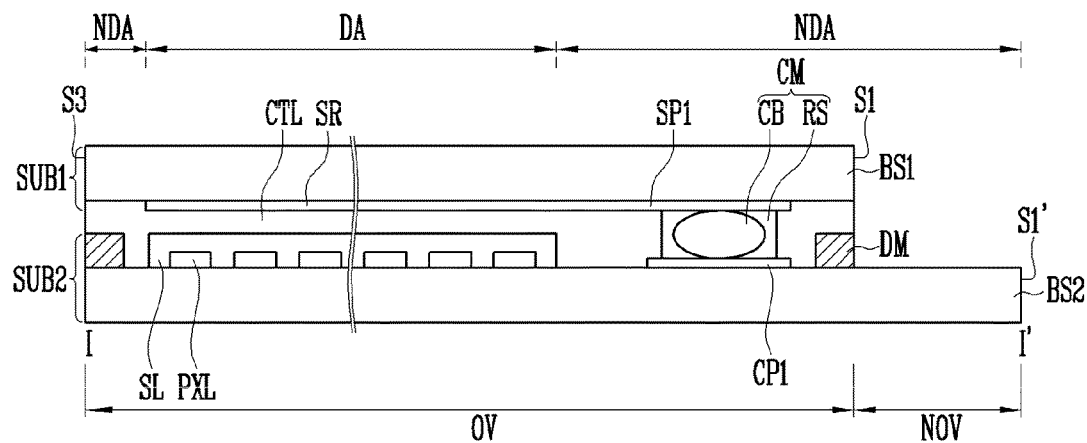
FIG. 2A is a cross-sectional view of FIG. 1 taken along the line I-I'.
Figure 2B:
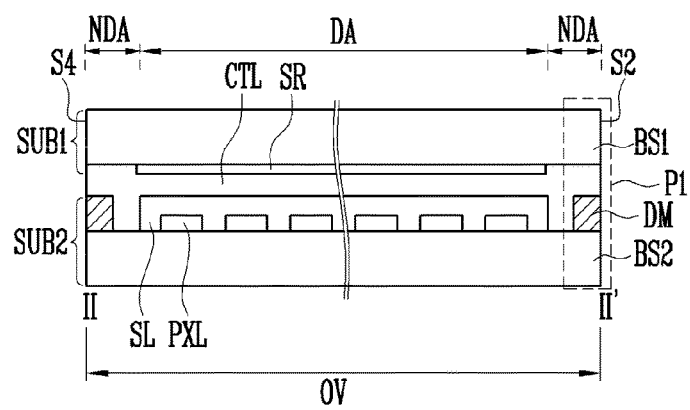
FIG. 2B is a cross-sectional view of FIG. 1 taken along the line II-II'.
Figure 3:
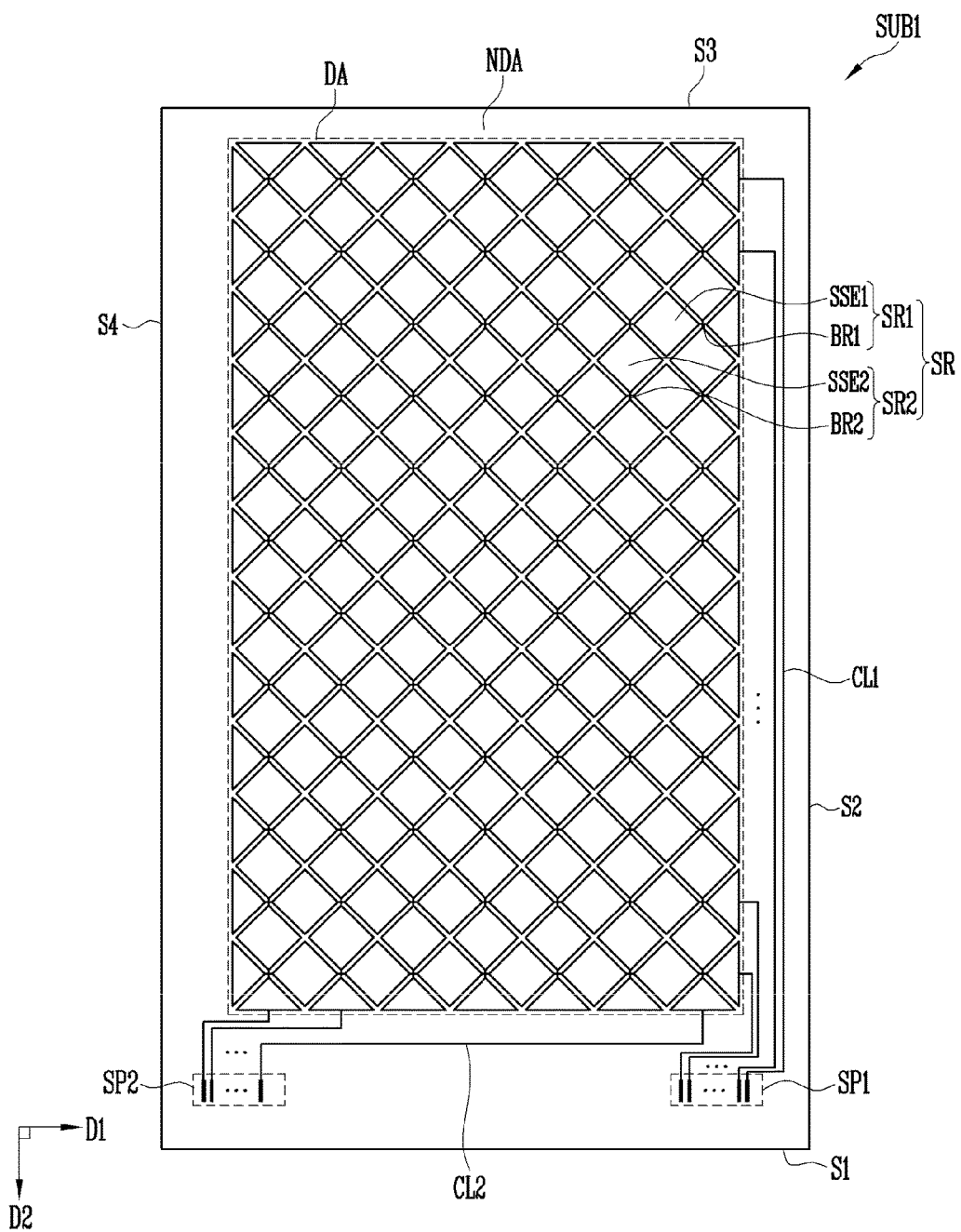
FIG. 3 is a plan view illustrating a first substrate of FIG. 1.
Figure 4:
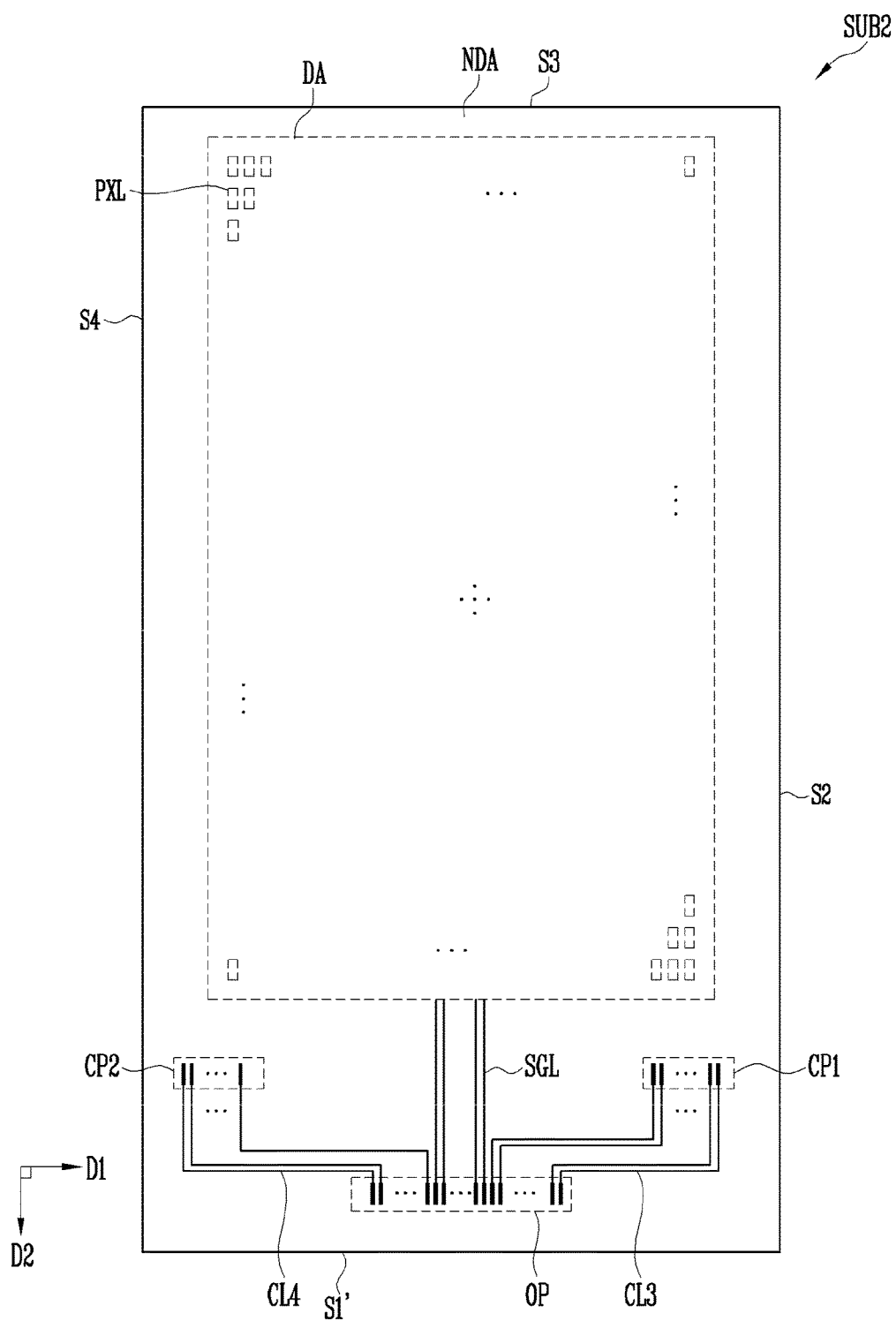
FIG. 4 is a plan view illustrating a second substrate of FIG. 1.

FIG. 1 is a plan view illustrating a display device according to an embodiment of the present disclosure, FIG. 2A is a cross-sectional view of FIG. 1 taken along the line II-II', and FIG. 2B is a cross-sectional view of FIG. 1 taken along the line II-II'. FIG. 3 is a plan view illustrating a first substrate of FIG. 1, and FIG. 4 is a plan view illustrating a second substrate of FIG. 1.

Referring to FIGS. 1 to 4, the display device DSP according to an embodiment of the present disclosure may include a display area DA, and a non-display area NDA on the periphery of the display area DA.

The display area DA is an area for displaying images. Examples of the images include visual information such as texts, videos, photographs, 2-dimensional or 3-dimensional images, and/or the like.

The non-display area NDA is provided on the periphery of the display area DA. In an embodiment of the present disclosure, the non-display area NDA may be formed on at least one side of the display area DA, or along a periphery (e.g., circumference) of the display area DA. In the non-display area NDA, there may be pad portions providing pads of wires. The pad portions may be formed at one side of the display area DA. The pad portions include a touch sensor pad portion, a connection pad portion, an operating pad portion, and/or the like, and the shapes of the pad portions may vary depending on the shapes of the touch sensor pad portion, the connection pad portion, the operating pad portion, and/or the like.

The display device DSP includes a first substrate SUB1, a second substrate SUB2, an interlayer CTL provided between the first substrate SUB1 and the second substrate SUB2, and conductive members CM.

The first substrate SUB1 and the second substrate SUB2 may be formed in various suitable shapes. For example, the first substrate SUB1 and the second substrate SUB2 may be provided in a circular, an oval, a triangular, or a square shape, etc. The first substrate SUB1 and the second substrate SUB2 may each also be provided in a closed figure including a line and a curve, for example, a semicircular figure.

In an embodiment of the present disclosure, the first substrate SUB1 and the second substrate SUB2 may be provided in a rectangular plate shape having two pair of lines that are parallel to each other. In such a case where the display device DSP is provided in a rectangular plate shape, one pair of lines may be longer than the other pair of lines. In an embodiment of the present disclosure, the display device DSP is illustrated as having a rectangular shape with one pair of long lines and another pair of short lines, the extension direction of the short lines being referred to as a first direction D1, and the extension direction of the long lines being referred to as a second direction D2. In this case, for the sake of convenience, one of the short lines of the display device DSP will be referred to as a first line S1, and three lines sequentially connected to the first line S1 will be referred to as second, third, and fourth lines S2, S3, and S4.

In an embodiment of the present disclosure, the first substrate SUB1 may have a smaller size area than that of the second substrate SUB2. The second substrate SUB2 may include an overlapping portion OV that overlaps the first substrate SUB1, and a non-overlapping portion NOV that does not overlap the first substrate SUB1, in a plan view.

In an embodiment of the present disclosure, the first line of the first substrate SUB1 and the first line of the second substrate SUB2 may not correspond to each other. Hereinafter, the first line of the first substrate SUB1 will be referred to as S1, and the first line of the second substrate SUB2 will be referred to as S1'. For example, the first substrate SUB1 may have the same or substantially the same length as the second substrate SUB2 in a first direction D1, but a shorter length than the second substrate SUB2 in a second direction D2. Accordingly, the non-overlapping portion NOV may be formed between the first line S1 of the first substrate SUB1 and the first line S1' of the second substrate SUB2. In a plan view, the rest of the lines, that is, the second to fourth lines S2 to S4 of the first substrate SUB1 and those lines of the second substrate SUB2 may substantially correspond to each other.

The first line S1 of the first substrate SUB1 and the first line S1' of the second substrate SUB2 may have the same or substantially the same shape. For example, the first line S1 of the first substrate SUB1 and the first line S1' of the second substrate SUB2 may both be straight lines extending in the first direction D1.

In an embodiment of the present disclosure, the display area DA and a portion of the non-display area NDA are provided on the overlapping portion OV. Further, a portion of the non-display area NDA is provided on the non-overlapping portion NOV.

The non-overlapping portion NOV may be provided as a place to attach a flexible print circuit board and/or the like to an external driver (e.g., a place to provide an operating pad portion OP that will be explained hereinafter). In an embodiment of the present disclosure, on an upper surface of the non-overlapping portion of the second substrate SUB2, an inspection pad portion, which is used to inspect whether or not the pixels or other components are defective, may be further provided.

In another embodiment of the present disclosure, the first line S1 of the first substrate SUB1 may have a shape different from its corresponding line of the second substrate SUB2. The shape of the first line S1 of the first substrate SUB1 may vary depending on the type, the arrangement, and/or the like of the pad portion.

The first substrate SUB1 includes a first base substrate BS1, a touch sensor SR provided on the first base substrate BS1, connection lines CL1 and CL2 (hereinafter collectively referred to as CL) connected to the touch sensor SR, and touch sensor pad portions SP1 and SP2 (hereinafter collectively referred to as SP) provided on end portions of the connection lines CL.

The first base substrate BS1 may be made of an insulating material having flexibility. The first base substrate BS1 may be made of various suitable types of material such as glass, polymer, metal, and/or the like. In some examples, the first base substrate BS1 may be an insulating substrate made of organic polymer. Examples of insulating substrate made of organic polymer include polystyrene, polyvinyl alcohol, polymethyl methacrylate, polyethersulfone, polyacrylate, polyetherimide, polyethylene napthalate, polyethylene terephthalate, polyphenylene sulfide, polyarylate, polyimide, polycarbonate, triacetate cellulose, cellulose acetate propionate, and/or the like, but without being limited thereto. The first base substrate BS1 may also be made of fiber glass reinforced plastic FRP.

The touch sensor SR is for sensing, when there is a touch by a user on the display device DSP, the touch and/or a pressure of the touch. The touch sensor SR is provided in the display area DA. The touch sensor SR may be a mutual capacitance sensor, a self-capacitance sensor, or a resistive sensor, but without being limited thereto as long as it is configured to sense a touch made by a user and/or a pressure of the touch. In an embodiment of the present disclosure, the touch sensor SR may be a mutual capacitance sensor that senses changes in capacitance based on a mutual interaction between two types of sensing electrodes, and hereinafter, explanation will be made based on an assumption that the touch sensor SR is such a mutual capacitance sensor.

The touch sensor SR includes a plurality of first sensor SR1 that extend in the first direction D1 and to which a sensing voltage may be applied, and a plurality of second sensors SR2 that extend in a direction different from the first direction D1, for example, in the second direction D2 that intersects the first direction D1. The first sensors SR1 may be capacitance-coupled with the second sensors SR2. A voltage may be changed by the capacitance-coupling.

Each of the first sensor SR1 includes a plurality of first sensing electrodes SSE1 arranged in the first direction D1, and a plurality of first bridges BR1 that connect the first sensing electrodes SSE1 that are adjacent to each other. The first sensing electrodes SSE1 may be provided in various suitable polygonal shapes such as four-sided shapes including a rod shape, a square shape, a rectangular shape, a diamond shape, and/or the like.

In an embodiment of the present disclosure, the first sensing electrodes SSE1 and the first bridges BR1 may be provided as a one-piece plate or in a mesh form including fine lines.

Each of the second sensors SR2 includes a plurality of second sensing electrodes SSE2 arranged in the second direction D2, and a plurality of second bridges BR2 that connect the second sensing electrodes SSE2 that are adjacent to each other. The second sensing electrodes SSE2 may also be provided in various suitable polygonal shapes, such as four-sided shapes including a rod shape, a square shape, a rectangular shape, a diamond shape, and the like.

The second sensing electrodes SSE2 and the second bridges BR2 may also be provided as a one-piece plate or in a mesh form including fine lines.

The first sensing electrodes SSE1 and the second sensing electrodes SSE2 may be arranged in a matrix form on the first base substrate BS1 such that they alternate each other (e.g., such that they are alternately arranged).

The first sensor SR1 and the second sensor SR2 are insulated from each other. In some examples in FIG. 3, it is illustrated that the first bridges BR1 and the second bridges BR2 cross each other, but in fact, they are insulated from each other with an insulating layer arranged between them. The first sensor SR1 and the second sensor SR2 may be provided on different layers, but without being limited thereto. In an embodiment of the present disclosure, the first sensing electrodes SSE1 and the second sensing electrodes SSE2 may be provided on the same layer, and the first bridges BR1 and the second bridges BR2 may be provided on different layers.

The connection lines CL1 and CL2 are for connecting the touch sensor SR to a driver for driving the touch sensor SR. The connection lines CL1 and CL2 are provided in the non-display area NDA. The driver may either be provided on the second substrate SUB2 to be explained hereinafter, or on an additional print circuit board and/or the like. The driver may include a location detection circuit. The connection lines CL may transmit a sensed input signal received from the driver to the first sensors SR1 and to the second sensors SR2, or transmit a sensed output signal received from the first sensors SR1 and the second sensors SR2 to the driver.

In an embodiment of the present disclosure, the connection lines CL may include a plurality of first connection lines CL1 and a plurality of second connection lines CL2. The first connection lines CL1 are connected to the first sensors SR1. Each of the first connection line CL1 may be connected to a row corresponding to the first sensor SR1. The first connection lines CL1 may appear to be bent for a plurality of times within the non-display area NDA in a plan view.

The second connection lines CL2 are connected to the second sensors SR2. Each of the second connection lines CL2 may be connected to a column corresponding to the second sensor SR2. The second connection lines CL2 may appear to be bent for a plurality of times within the non-display area NDA in a plan view.

The touch sensor pad portion SP is configured to transmit a signal between the touch sensor SR and the driver. The touch sensor pad portion SP is provided in the non-display area NDA, and the touch sensor pad portion SP is connected to end portions of the connection lines CL. The touch sensor pad portion SP includes a plurality of touch sensor pads provided on the end portions of the connection lines CL. The touch sensor pad portion SP is electrically connected to connection pad portions CP1 and CP (hereinafter referred to as CP) of the second substrate SUB2 to be explained hereinafter through a conductive member, also to be explained hereinafter. The touch sensor SR is connected to the connection lines CL, the touch sensor pad portion SP is connected to the end portions of the connection lines CL, the touch sensor pad portion SP is connected to the connection pad portion CP through the conductive member, and finally the connection pad portion CP is connected to the driver through the operating pad portion OP to be explained hereinafter. By the aforementioned, a signal related to a touch may be mutually transmitted between the driver and the touch sensor.

The touch sensor pad portion SP is provided in the non-display area NDA that is adjacent to at least one of the four lines of the first substrate SUB1. In an embodiment of the present disclosure, it is illustrated that the touch sensor pad portion SP is provided in the non-display area NDA that is adjacent to the first line S1.

The touch sensor pad portion SP may include a first touch sensor pad portion SP1 provided on end portions of the first connection lines CL1 and a second touch sensor pad portion SP provided on end portions of the second connection lines CL2. The first touch sensor pad portion SP1 and the second touch sensor pad portion SP2 may be provided adjacent to each other or spaced apart from each other, in a plan view. In an embodiment of the present disclosure, the first touch sensor pad portion SP1 and the second touch sensor pad portion SP2 are provided on either side of the first substrate SUB1 along the first direction D1, wherein the first touch sensor pad portion SP1 and the second touch sensor pad portion SP2 may be spaced apart from each other.

In an embodiment of the present disclosure, the touch sensor SR, the connection lines CL, and the touch sensor pad portion SP may all be made of a conductive material. Examples of conductive material that may be used herein include metal, alloy of metal, conductive polymer, conductive metal oxide, nano-conductive material, and/or the like. In an embodiment of the present disclosure, examples of metal that may be used herein include copper, silver, gold, platinum, palladium, nickel, tin, aluminum, cobalt, rhodium, iridium, iron, ruthenium, osmium, manganese, molybdenum, tungsten, niobium, tantalum, titan, bismuth, antimony, lead, and/or the like. Examples of conductive polymer that may be used herein include polythiophene, polypyrrole, polyaniline, polyacetylene, polyphenylene, and/or the like. According to some example embodiments, from among polythiophenes, PEDOT/PSS may be used. Examples of conductive metal oxide that may be used herein include indium tin oxide (ITO), indium zinc oxide (IZO), antimony zinc oxide (AZO), indium tin zinc oxide (ITZO), zinc oxide (ZnO), tin oxide ($SnO_2$), and/or the like. Examples of nano conductive compound that may be used herein include silver nanowire (AgNW), carbon nano tube, graphene, and/or the like.

The second substrate SUB2 faces the first substrate SUB1, and displays images.

The second substrate SUB2 includes a second base substrate BS2, a pixel portion PX, and a dummy portion DM spaced apart from the pixel portion PX.

Figure 5B:
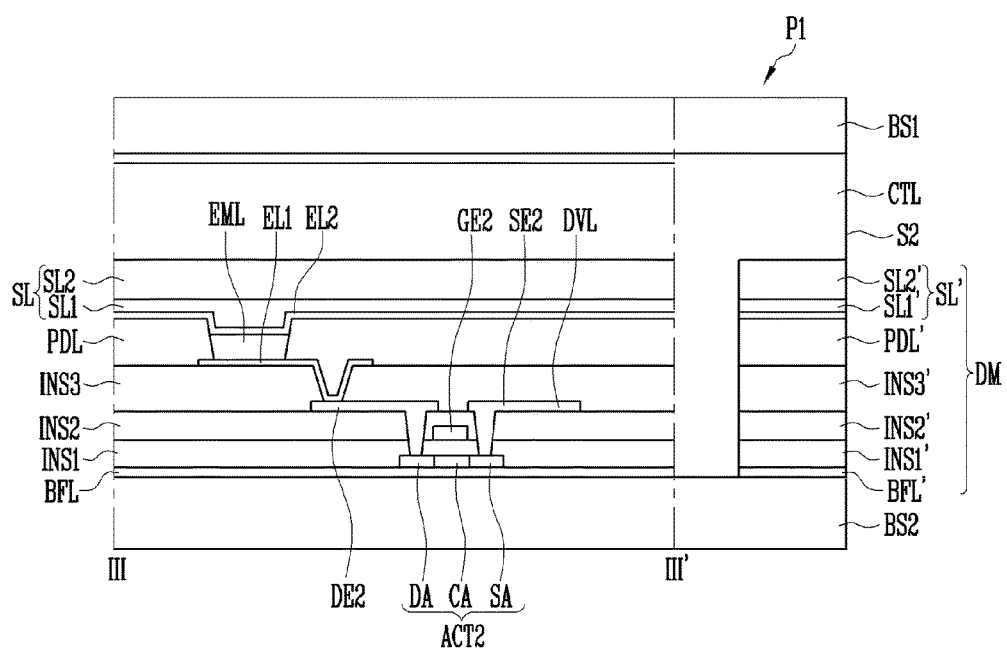
FIG. 5B is a cross-sectional view of FIG. 5A taken along the line III-III', also illustrating a portion corresponding to portion P1 of FIG. 2B.

FIG. 5A is a plan view illustrating a portion of the pixel portion PX, and FIG. 5B is a cross-sectional view of FIG. 5A taken along the line FIG. 5B illustrates a portion that corresponds to portion P1 of FIG. 2B together with the dummy portion DM, in order to explain the dummy portion DM in comparison with the pixel portion PX.

Hereinafter, explanation will be made on the second base substrate BS2, the pixel portion PX, and the dummy portion DM with reference to FIGS. 1 to 5B.

The second base substrate BS2 is provided substantially in the same shape as the first base substrate BS1. The second base substrate BS2 is provided to have a same or a greater size area of the first base substrate BS1.

The pixel portion PX is provided on the second base substrate BS2. The pixel portion PX includes at least one pixel PXL for displaying an image, and a sealing layer SL provided on the pixel PXL.

The display area DA is provided with a plurality of pixels PXL that realize images.

The second base substrate BS2 is provided with signal lines SGL connected to the pixel PXL, an operating pad portion OP on end portions of the signal lines SGL, and a connection pad portion CP corresponding to the touch sensor pad portion SP.

The pixel PXL is connected to the signal lines SGL. The signal lines SGL provide a signal to each pixel PXL, and the signal lines SGL include a gate line GL, a data line DL, and a driving voltage line DVL, and furthermore, other types of wires if necessary.

The gate line GL may extend in one of the first direction D1 and the second direction D2. The data line DL may extend in the direction that crosses the gate line GL. The driving voltage line DVL may extend in substantially a same direction as the data line DL. The gate line GL transmits a scan signal to the thin film transistor, the data line DL transmits a data signal to the thin film transistor, and the driving voltage line DVL provides a driving voltage to the thin film transistor.

Each of the gate line GL, the data line DL, and the driving voltage line DVL is realized as a plurality of such lines.

Each of the signal lines SGL is provided to extend over the display area DA and the non-display area NDA.

The pixel PXL displays an image, and is provided in the display area DA. The pixel PXL may be realized as a plurality of pixels PXL arranged in a matrix form. Herein, it is illustrated that the pixel PXL has a rectangular shape, but without being limited thereto. The pixel PXL may be modified to have various suitable shapes. Furthermore, when the pixel PXL is realized as a plurality of pixels PXL, each pixel PXL may have a different size area. For example, pixels PXL of different colors may have different size areas and/or different shapes according to color.

Each pixel PXL includes a thin film transistor connected to a corresponding signal line of the signal lines SLG, a light emitting element connected to the thin film transistor, and a capacitor Cst.

The thin film transistor may include a driving thin film transistor TR2 for controlling the light emitting element, and a switching thin film transistor TR1 for switching on/off the driving thin film transistor TR2. In an embodiment of the present disclosure, one pixel PXL includes two thin film transistors TR1 and TR2, but without being limited thereto. For example, one pixel PXL may include one thin film transistor and one capacitor, or three or more thin film transistors and two or more capacitors.

The switching thin film transistor TR1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to the gate electrode (that is, second gate electrode GE2) of the driving thin film transistor TR2. The switching thin film transistor TR1 transmits a data signal applied to the data line DL to the driving thin film transistor TR2 according to the scan signal applied to the gate line GL.

The driving thin film transistor TR2 includes the second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the light emitting element.

The light emitting element includes a light emitting layer EML, and a first electrode EL1 and a second electrode EL2 opposite each other with the light emitting layer EML arranged between them. The first electrode EL1 is connected to the second drain electrode DE2 of the driving thin film transistor TR2. A common voltage is applied to the second drain electrode EL2, and the light emitting layer EML displays an image by emitting light or not emitting light according to an output signal of the driving thin film transistor TR2. In this case, the light being emitted from the light emitting layer EML may vary depending on the material of the light emitting layer EML. The light being emitted from the light emitting layer EML may be a colored light or a white light.

The capacitor Cst is connected between the second gate electrode GE2 and the second source electrode SE2 of the driving thin film transistor TR2, and the capacitor Cst charges and maintains the data signal being input into the second gate electrode GE2 of the driving thin film transistor TR2.

The pixel portion PX according to an embodiment of the present disclosure is provided as having multiple layers. Hereinafter, the pixel portion according to an embodiment of the present disclosure will be explained in the order of lamination.

The pixel portion PX according to an embodiment of the present disclosure is provided on the second base substrate BS2.

On the second base substrate BS2, a buffer layer BFL is formed. The buffer layer BFL prevents or substantially prevents impurities from spreading across the switching and the driving thin film transistors TR1 and TR2. The buffer layer BFL may be made of silicon nitride (SiNx), silicon oxide (SiOx), silicon oxynitride (SiOxNy), and/or the like. The buffer layer may be omitted depending on the material and processing conditions of the base substrate (BS).

On the buffer layer BFL, a first active pattern ACT1, and a second active pattern ACT2 are provided. The first active pattern ACT1 and the second active pattern ACT2 may be made of a semiconductor material. Each of the first active pattern ACT1 and the second active pattern ACT2 includes a source area, a drain area, and a channel area provided between the source area and the drain area. Each of the first active pattern ACT1 and the second active pattern ACT2 may be a semiconductor pattern made of polysilicon, amorphous silicon, oxide semiconductor, and/or the like. The channel area is a semiconductor pattern that is not doped with impurities. The channel area may be an intrinsic semiconductor. Each of the source area and the drain area may be a semiconductor pattern doped with impurities. Examples of impurities that may be doped on the source area and the drain area include n-type impurities, p-type impurities, and metals.

On the first active pattern ACT1 and the second active pattern ACT2, a first insulating layer INS1 is provided.

On the first insulating layer INS1, the first gate electrode GE1 and the second gate electrode GE2 connected to the gate line GL are provided. Each of the first gate electrode GE1 and the second gate electrode GE2 is formed to cover an area corresponding to a respective one of the channel area of the first active pattern ACT1 and the second active pattern ACT2.

On the first and second gate electrodes GE1 and GE2, a second insulating layer INS2 is provided to cover the first and second gate electrodes GE1 and GE2.

On the second insulating layer INS2, the first source electrode SE1, the first drain electrode DE1, the second source electrode SE2, and the second drain electrode DE2 are provided. The first source electrode SE1 and the first drain electrode DE1 contact the source area and the drain area of the first active pattern ACT1, respectively, through contact holes (e.g., contact openings) formed in the first insulating layer INS1 and the second insulating layer INS2. The second source electrode SE2 and the second drain electrode DE2 contact the source area and the drain area of the second active pattern ACT2, respectively, through the contact holes formed in the first insulating layer INS1 and the second insulating layer INS2.

Meanwhile, a portion of the second gate electrode GE2 and a portion of the driving voltage line DVL are a first capacitor electrode CE1 and a second capacitor electrode CE2, respectively, which form the capacitor Cst having the second insulating layer INS2 arranged therebetween.

On the first source electrode SE1, and the first drain electrode DE1, the second source electrode SE2, and the second drain electrode DE2, a third insulating layer INS3 is formed. The third insulating layer INS3 may serve as a film that protects the switching and the driving thin film transistors TR1 and TR2, or as a planarization film for planarizing a top surface of the switching and the driving thin film transistors TR1 and TR2.

On the third insulating layer INS3, a first electrode EL1 is provided as an anode of the light emitting element. The first electrode EL1 is connected to the second drain electrode DE2 of the driving thin film transistor TR2 through a contact hole (e.g., a contact opening) formed in the third insulating layer. Herein, the first electrode EL1 may be used as a cathode instead; however, hereinafter explanation will be made based on an assumption that it is used as an anode.

The first electrode EU may be made of a material having a high work function. In the case of providing an image towards a lower direction of the base substrate BS in the aforementioned illustrations, the first electrode EL1 may be a transparent conductive film that is made of indium tin oxide (ITO), indium zinc oxide (IZO), zinc oxide (ZnO), indium tin zinc oxide (ITZO), and/or the like. In the case of providing an image towards an upper direction of the base substrate BS in the aforementioned illustrations, the first electrode EU may be a transparent conductive film made of a metal reflecting film having Ag, Mg, Al, Pt, Pd, Au, Ni, Nd, Ir, Cr, and/or the like, together with indium tin oxide (ITO), indium zinc oxide (IZO), zinc oxide (ZnO), indium tin zinc oxide (ITZO), and/or the like.

On the second base substrate BS2 on which the first electrode EL1 is formed, a pixel defining layer PDL is provided that divides the pixel area such that each divided pixel area corresponds to each pixel PXL. The pixel defining layer PDL exposes an upper surface of the first electrode EL1, and protrudes from the base substrate BS along the periphery (e.g., circumference) of the pixel PXL.

On the pixel area surrounded by the pixel defining layer PDL, a light emitting layer EML is provided, and on the light emitting layer EML, the second electrode EL2 is provided.

The sealing layer SL covers the pixel PXL to protect the pixel PXL.

The sealing layer SL is provided on the second electrode EL2.

The sealing layer SL may either be a single layer, or multiple layers. In an embodiment of the present disclosure, the sealing layer SL may include a first sealing layer SL1 and a second sealing layer SL2.

In an embodiment of the present disclosure, the first sealing layer SL1 and the second sealing layer SL2 may include materials different from each other. For example, the first sealing layer SL1 may be made of an organic material, while the second sealing layer SL2 is made of an inorganic material. The number of the layers or materials of the first sealing layer SL1 and the second sealing layer SL2 are not limited to the aforementioned, however, and thus various suitable modifications are possible.

In another embodiment of the present disclosure, each of the first sealing layer SL1 and the second sealing layer SL2 may be realized as a plurality of layers that are laminated alternately to each other. In such a case where each of the first sealing layer SL1 and the second sealing layer SL2 is realized as a plurality of layers laminated alternately to each other, it is possible to effectively shield the pixel PXL from air (e.g., oxygen), moisture, and/or other impurities infiltrating from outside.

The dummy portion DM is provided on the overlapping portion OV within the non-display area NDA of the second base substrate BS2. The dummy portion DM prevents or substantially prevents defects from occurring at a cutting phase when manufacturing the display device, and also prevents or substantially prevents elements such as moisture, oxygen, and/or the like from infiltrating into the pixel portion PX. This will be explained in more detail hereinafter when explaining the manufacturing method of the display device.

The dummy portion DM is formed along the edge of the first substrate SUB1 such that it is spaced apart from the pixel portion PX by a certain distance in a plan view. In an embodiment of the present disclosure, the dummy portion DM may be provided along every line of the first to the fourth lines S1, S2, S3, and S4, but without being limited thereto. That is, the dummy portion DM may be provided along only some of the first to the fourth lines S1, S2, S3, and S4 of the first substrate SUB1. One side of the dummy portion DM corresponds to the edge of the first substrate SUB1 in a plan view, and an outer side of the dummy portion DM protrudes externally in a cross-sectional view.

In the present embodiment, it was explained that the dummy portion DM is provided along at least some of the first to the fourth lines S1, S2, S3, and S4 of the first substrate SUB1, but there is no limitation thereto. Thus, when the first substrate SUB1 is provided in a different shape, the position of the dummy portion DM may differ as well. For example, in the case where the first substrate SUB1 is formed in a circular shape, an oval shape, or a polygonal shape, the dummy portion DM may be provided along at least some of the lines of the circular, the oval, or the polygonal shape.

The dummy portion DM may be realized as a multiple-layered portion having a set or predetermined height. In a cross-sectional view, the dummy portion DM may be formed to protrude from an upper surface of the second base substrate BS2 and to have a same or a similar height as the pixel portion PX. In an embodiment of the present disclosure, the height of the dummy portion DM may be at least 50% of that of the pixel portion PX. In another embodiment of the present disclosure, the height of the dummy portion DM may be at least 70% of that of the pixel portion PX. In another embodiment of the present disclosure, the height of the dummy portion DM may be at least 90% of that of the pixel portion PX.

In another embodiment of the present disclosure, the dummy portion DM may be manufactured at the same step as at least one of the steps of manufacturing the pixel PXL. As a result, the dummy portion DM may include a layer corresponding to at least one of the layers that constitute the pixel PXL, and the dummy portion DM may be made of the same or substantially the same material as at least one of layers that constitute the pixel PXL.

Referring to FIG. 5B again, the dummy portion DM according to an embodiment of the present disclosure may include a dummy buffer layer BFL', a dummy first to third insulating layers INS1', INS2', and INS3', a dummy pixel defining layer PDL', a dummy second electrode EL2', and a dummy sealing layer SL' laminated on the second base substrate BS2 in the aforementioned order. The dummy buffer layer BFL', the dummy first to the dummy third insulating layers INS1', INS2', and INS3', the dummy pixel defining layer PDL', the second electrode EL2', and the dummy sealing layer SL' may correspond to the buffer layer BFL, the first to the third insulating layers INS1, INS2, and INS3, the pixel defining layer PDL, the second electrode EL2, and the sealing layer SL, respectively, and the corresponding layers may be made of the same or substantially the same material.

For example, the dummy buffer layer BFL' may be provided on the second base substrate BS2, and the dummy buffer layer BFL' may be made of the same or substantially the same material as the buffer layer BFL of the pixel portion PX. The dummy first insulating layer INS1', the dummy second insulating layer INS2', and the dummy third insulating layer INS3' may be provided on the dummy buffer layer BFL', which may be made of the same or substantially the same material as the first insulating layer INS1, the second insulating layer INS2, and the third insulating layer INS3 of the pixel portion PX, respectively. The dummy pixel defining layer PDL' may be provided on the dummy third insulating layer INS3', and be made of the same or substantially the same material as the pixel defining layer PDL of the pixel portion PX. The dummy second electrode EL2' may be provided on the dummy pixel defining layer PDL', and be made of the same or substantially the same material as the second electrode EL2 of the pixel portion PX. The dummy sealing layer SL' may be provided on the dummy second electrode EL2', and be made of the same or substantially the same material as the sealing layer SL of the pixel portion PX.

In an embodiment of the present disclosure, at least some of the layers constituting the dummy portion DM are made of the same or substantially the same material as at least some of the corresponding layers of the pixel portion PX; however, not all layers of the dummy portion DM may be made of the same or substantially the same material as the corresponding layers of the pixel portion PX. For example, the dummy first insulating layer INS1' to the third dummy insulating layer INS3' of the dummy portion DM may be made of the same or substantially the same material as the first insulating layer INS1 to the third insulating layer INS3 of the pixel portion PX, while the dummy pixel defining layer PDL' of the dummy portion DM is made of a material different from the pixel defining layer PDL of the pixel portion PX.

In an embodiment of the present disclosure, the layers constituting the dummy portion DM are not limited to the layers illustrated in the drawings. Some of the layers illustrated may be omitted and/or a suitable layer may be further added.

The layers to be omitted from the dummy portion DM may be those having insignificant contribution to the height of the dummy portion DM. In FIG. 5B, the thickness of the layers have been reduced or enlarged for ease of illustration, and thus it should be considered that actual thicknesses may be different from the illustrations. Thus, the layers that may be omitted have nothing to do with the illustrations in FIG. 5B. For example, the thicknesses of the numerous layers constituting the thin film transistor (e.g., the first and the second active patterns, the gate electrode, the source electrode and/or the like) may be less than the thicknesses of the first to the third insulating layers INS1, INS2, and INS3 and/or the pixel defining layer PDL. Therefore, the dummy portion DM may include layers that correspond to the first to the third insulating layers INS1, INS2, and INS3 or the pixel defining layer PDL; however, the numerous layers constituting the thin film transistor may be omitted. In another embodiment of the present disclosure, the thicknesses of the first to the third insulating layers INS1, INS2, and INS3 and/or the pixel defining layer PDL may be less than the thickness of the sealing layer. Therefore, the first to the third insulating layers INS1, INS2, and INS3 and/or the pixel defining layer PDL may be omitted as well.

In another embodiment of the present disclosure, all the layers from the dummy buffer layer BFL' to the dummy second electrode EL2' may be omitted, and accordingly, the dummy portion DM may include only the dummy sealing layer SL'. In FIG. 5B, it appears that the dummy sealing layer SL' has a thickness similar to other layers, however, it may actually be significantly thicker than other layers. Thus, even when all the layers from the dummy buffer layer BFL' to the dummy second electrode EL2' are omitted, the height of the dummy portion DM will not be significantly less than the height of the pixel portion PX.

Furthermore, in an embodiment of the present disclosure, the dummy portion DM may of course further include layers that correspond to the active pattern, the gate electrode, the source electrode, and the drain electrode of the pixel portion PX.

In an embodiment of the present disclosure, an upper surface of the second base substrate BS2 may be exposed on the space between the pixel portion PX and the dummy portion DM. However there is no limitation thereto, and thus a component such as a signal wire, insulating layer, and/or the like may be further provided between the pixel portion PX and the dummy portion DM if necessary.

Referring to FIG. 1 to FIG. 5B again, the connection pad portion CP is provided on a position that corresponds to the touch sensor pad portion SP of the first substrate SUB1 of the non-display area NDA substantially in the same shape as well. The connection pad portion CP overlaps the touch sensor pad portion SP in a plan view. The connection pad portion CP may include connection pads each corresponding one-to-one to each of the touch sensor pads of the touch sensor pad portion SP. The connection pad portion CP is configured to transmit a signal to and/or from the driver. The connection pad portion CP is electrically connected to the touch sensor pad portion SP of the first substrate SUB1 through the conductive member to be explained hereinafter.

The connection pad portion CP may include a first connection pad portion CP1 that corresponds to the first touch sensor pad portion SP, and a second connection pad portion CP2 that corresponds to the second touch pad portion SP2.

Additional connection lines are connected to the connection pad portion CP. A third connection line CL3 is connected to the first connection pad portion CP1, and a fourth connection line CL4 is connected to the second connection pad portion CP2.

The signal lines SGL are connected to the pixels PXL. The signal lines SGL provide image-related signals to the pixels PXL. For example, the gate line GL transmits a scan signal from the driver to the thin film transistor, the data line DL transmits a data signal to the thin film transistor, and the driving voltage line DVL provides a driving voltage to the thin film transistor. The signal lines SGL may further include various suitable lines for realizing an image, and various suitable signals may be applied to each of the signal line SGL.

The operating pad portion OP is provided in the non-display area NDA, and the operating pad portion OP is connected to end portions of the signal lines SGL and to the end portions of additional connection lines, that is, the third connection lines CL3 and the fourth connection lines CL4. The operating pad portion OP includes a plurality of operating pads provided on the end portions of the signal lines SGL. The operating pad portion OP is configured to transmit signals between the driver and the pixels PXL and the connection pad portion CP.

The operating pad portion OP is provided in the non-display area NDA adjacent to at least one of the four lines of the first substrate SUB1. For example, the operating pad portion OP may be provided on the non-overlapping portion NOV on the second substrate SUB2.

The operating pad portion OP may be connected to another component such as a flexible print circuit board with an additional conductive member provided between the operating pad portion OP and the another component.

The connection pad portion CP, the signal lines SGL, the additional connection lines, and the operating pad portion (OP) may be made of a conductive material. Examples of conductive material that may be used herein include metal, alloy of metal, conductive polymer, conductive metal oxide, nano conductive material, and/or the like. In an embodiment of the present disclosure, examples of metal that may be used herein include copper, silver, gold, platinum, palladium, nickel, tin, aluminum, cobalt, rhodium, iridium, iron, ruthenium, osmium, manganese, molybdenum, tungsten, niobium, tantalum, titan, bismuth, antimony, lead, and/or the like. Examples of conductive polymer that may be used herein include polythiophene, polypyrrole, polyaniline, polyacetylene, polyphenylene, and/or the like. According to some examples, from among polythiophene, PEDOT/PSS may be used. Examples of conductive metal oxide that may be used herein include indium tin oxide (ITO), indium zinc oxide (IZO), antimony zinc oxide (AZO), indium tin zinc oxide (ITZO), zinc oxide (ZnO), tin oxide ($SnO_2$), and/or the like. Examples of nano conductive compound that may be used herein include silver nanowire (AgNW), carbon nano tube, graphene, and/or the like.

The connection pad portion CP, the signal lines SGL, the additional connection lines, and the operation pad portion OP may be manufactured together when manufacturing the pixels PXL.

As aforementioned, on the display device DSP according to an embodiment of the present disclosure, the first substrate SUB1 and the second substrate SUB2 are provided, and between the first substrate SUB1 and the second substrate SUB2, the interlayer CTL and the conductive members CM are provided.

The interlayer CTL is provided between the first substrate SUB1 and the second substrate SUB2. For example, in the display area DA, the interlayer CTL is provided between the first substrate SUB1 and the pixel portion PX, and in the non-display area NDA, the interlayer CTL is provided between the first substrate SUB1 and the dummy portion DM. The interlayer CTL is also filled in the space between the pixel portion PX and the dummy portion DM.

The interlayer CTL may protect the touch sensor SR of the first substrate SUB1, and bond the first substrate SUB1 and the second substrate SUB2. The interlayer CTL may have viscosity or adhesion to perform the bonding function.

The interlayer CTL may be made of a transparent material so as to transmit therethrough an image from the second substrate SUB2. Furthermore, the interlayer CTL may be made of an insulating material, and may have flexibility.

There is no limitation to the material of the interlayer CTL as long as the material can protect the touch sensor of the first substrate SUB1 and be used to bond the first substrate SUB1 and the second substrate SUB2. In an embodiment of the present disclosure, the interlayer CTL may be made of an organic material. The organic material may be a photocurable or thermocurable material that may be selected from various suitable organic polymeric materials. For example, the organic material may include acrylic acid ester polymer. Otherwise, the organic material may include epoxy resin. Examples of epoxy resin that may be used herein include bisphenol A, bisphenol F, bisphenol AD, bisphenol S, xylenol, phenol novolac, cresol novolac, tetraphenylolmethane, polyethylene glycol, polypropylene glycol, hexane diol, trimethylolpropane, propylene oxide bisphenol A, and/or the like.

The interlayer CTL may be provided in a suitable thickness in not only the display area DA but also in the non-display area NDA adjacent to the display area DA. For example, a side corresponding to at least one of the first to the fourth lines S1, S2, S3, and S4 of the first substrate may be exposed to the outside. That is, the interlayer CTL is arranged along the edge of the first substrate SUB1. The interlayer CTL may be provided between the first substrate SUB1 and the dummy portion DM in a cross-sectional view, and in the far outskirts of the first substrate SUB1 together with the dummy portion DM in a plan view. Accordingly, a side of the interlayer CTL and the dummy portion DM may be exposed to the outside at the first to the fourth lines S1, S2, S3, and S4 of the first substrate SUB1.

The conductive member CM is provided between the first substrate SUB1 and the second substrate SUB2, and the conductive member CM connects the touch sensor pad portion SP of the first substrate SUB1 and the connection pad portion of the second substrate SUB2. The conductive member CM is formed in an area where the touch sensor pad portion SP and the connection pad portion CP are formed in a plan view. Accordingly, the conductive member CM overlaps the touch sensor pad portion SP and the connection pad portion CP.

The conductive member CM may include a plurality of conductive balls CB and an insulator RS that surrounds the conductive balls CB.

The conductive balls CM are made of a material that allows electrical conduction, and there is no particular limitation thereto. In an embodiment of the present disclosure, the conductive balls CB may be made of particles having conductivity within themselves like metals such as nickel, iron, copper, aluminum, tin, zinc, chromium, cobalt, silver, gold, antimony, compounds thereof, oxides thereof, solder, carbon, and/or the like. In another embodiment of the present disclosure, the conductive balls CB may be made of particles of thin metallic layers made by performing electroless plating on the surface of a nucleus such as glass, ceramic, and polymer. The polymer may be an organic polymer, for example, various suitable types of epoxy resin. In an embodiment of the present disclosure, the epoxy resin may be bisphenol F epoxy resin. Otherwise, the conductive balls CB may be made of particles having conductivity themselves or particles having conductivity as a result of coating the surface of the particles of thin metal layers of a nucleus with an insulating material.

The insulator RS may be one that has adhesion to firmly bond the touch sensor pad portion SP and the connection pad portion CP, but without being limited thereto. In an embodiment of the present disclosure, the insulator RS may include gum resin, polymer resin, and/or the like. Examples of polymer resin that may be used herein include thermoplastic polymer resin, thermosetting polymer resin, radical polymerized resin, and/or the like.

Examples of thermoplastic resin that may be used herein include styrene butadiene resin, ethylene vinyl resin, ester resin, silicon resin, phenoxy resin, acryl resin, amide resin, acrylate resin, polyvinylbutyral resin, and/or the like. Examples of thermosetting resin that may be used herein include expoxy resin, phenol resin, melamine resin, and/or the like. Examples of radical polymerized resin that may be used herein include acrylate, such as methylacrylate, ethylacrylate, bisphenol A ethyleneglycol modified diacrylate, isocyanuric acid ethyleneglycol modified diacrylate, tripropylene glycol diacrylate, tetraethylene glycol diacrylate, polyethylglycol diacrylate, pentaerythritol triacrylate, trimethylolpropane triacrylate, trimethylolpropane propyleneglycol triacrylate, trimethylolpropane ethyleneglycol triacrylate, isocyanuric acid ethyleneglycol modified triacylate, dipentaerythritol pentacrylate, dipentaerythritol hexacrylate, pentaerythritol tetracrylate, dicyclopentenyl acrylate, and tricyclodecanyl acrylate; methacrylate, maleimide, unsaturated polyester, acrylic acid, vinylacetate, acrylonitrile, methacrylonitrile, and/or the like.

In the drawings, it is illustrated that there is one conductive ball CB, however, this is for ease of illustration, and thus there may be a plurality of conductive balls CB in the conductive member CM.

Each conductive ball CB may be provided in a generally circular or an oval shape between the first substrate SUB1 and the second substrate SUB2. The conductive ball CB may be provided in an oval shape between the touch sensor pads and the connection pads that face each other, and besides these areas, the conductive ball CB may be provided in a generally circular shape. The conductive ball CB is originally provided in a circular shape, however, between the first substrate SUB1 and the second substrate SUB2, the conductive ball CB is later transformed into an oval shape as it is compressed in a vertical direction during the process of manufacturing the display device. Because the space between the touch sensor pad portions and the connection pads that face each other is narrower than other areas, the conductive member CM arranged between the touch sensor pads and the connection pads that face each other may be provided in a generally oval shape.

The display devices having the aforementioned structure may be formed one at a time, however, it is also possible to manufacture a plurality of such display devices concurrently (e.g., at the same time). Therefore, a method of manufacturing a plurality of display devices will be explained hereinafter.

The display device according to an embodiment of the present disclosure may be formed by preparing a first mother substrate, preparing a second mother substrate having a plurality of unit areas divided by an imaginary line, forming a pixel portion in the unit areas, forming a dummy portion along the imaginary line, bonding the first mother substrate and the second mother substrate having an interlayer arranged therebetween, and cutting the first and the second mother substrate along the imaginary line. In this case, at least a portion of the pixel portion and at least a portion of the dummy portion are formed by the same process.

The method for manufacturing the display device will be explained with reference to FIGS. 6A to 6F that are cross-sectional views sequentially illustrating the method for manufacturing the display device according to an embodiment of the present disclosure. Hereinafter, explanation will be made with reference to FIGS. 1 to 5B besides the aforementioned drawings.

Figure 6A:
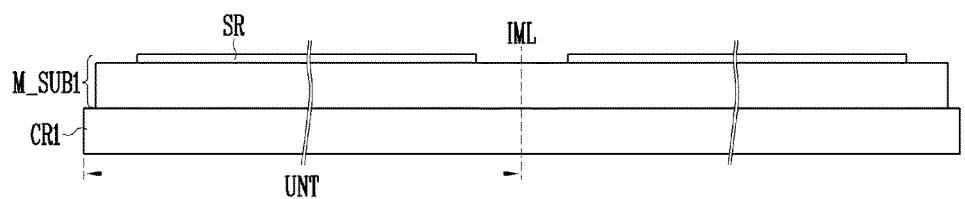
FIGS. 6A to 6F are cross-sectional views sequentially illustrating a method for manufacturing a display device according to an embodiment of the present disclosure.

Referring to FIG. 6A. the first mother substrate M_SUB1 is prepared. On a rear surface of the first mother substrate M_SUB1, a first carrier substrate CR1 is provided configured to support the first mother substrate M_SUB1. The first mother substrate M_SUB1 and the first carrier substrate CR1 contact each other by static electricity, the Van der Waals' force, and/or the like.

The first mother substrate M_SUB1 may include one unit area or a plurality of unit areas UNT. The unit area UNT is the portion that corresponds to each display device. In every unit area UNT, a first substrate SUB1 of each display device is formed. In the drawings, only some parts of the unit areas UNT are illustrated to explain with a main focus on the portions adjacent to each other, but there is no limitation thereto. For example, unit areas UNT in the first mother substrate M_SUB1 may be formed to have the same or substantially the same size, and may be arranged in a matrix form. In another embodiment of the present disclosure, however, unit areas UNT in the first mother substrate M_SUB1 may be formed to have different sizes, and may be arranged in various suitable forms according to the size of the first mother substrate M_SUB1.

The unit area UNT is divided by the imaginary line IML. The imaginary line IML divides each unit area UNT by surrounding each unit area UNT. The imaginary line IML may be arranged to surround a portion of the unit area UNT, or between two unit areas UNT. Accordingly, when there is a plurality of unit areas UNT, at least one side of each unit area UNT may be in contact with another unit area UNT with the imaginary line IML arranged therebetween. The imaginary line IML is used as a cutting line in a subsequent process. The first mother substrate M_SUB1 may be cut along the imaginary line IML into a plurality of unit areas UNT. In this case, when only one unit area UNT is provided, the unit area UNT may be defined by the imaginary line IML on the first mother substrate M_SUB1, and the exterior portion defined by the imaginary line IML may be cut off and thus removed. As a result, at least one first substrate SUB1 may be formed at the same time.

In an embodiment of the present disclosure, two unit areas UNT adjacent to each other may either be in contact with each other, or spaced apart from each other. In the drawings, it is illustrated that the two unit areas UNT adjacent to each other are in contact with each other with one imaginary line IML arranged therebetween; however, the present invention is not limited thereto. That is, the two unit areas UNT spaced apart from each other may have been divided by two or more imaginary lines IML.

The step of preparing the first mother substrate M_SUB1 includes a step of preparing a first base substrate BS1, and forming a touch sensor SR, connection lines CL, and a touch sensor pad portion SP on the first base substrate BS1.

The first base substrate BS1 may be laminated on the first carrier substrate CR1 and then cured.

The touch sensor SR, the connection lines CL, and the touch sensor pad portion SP may be formed on the first base substrate BS1 in various suitable processes. For example, the touch sensor SR, the connection lines CL, and the touch sensor pad portion SP may be formed by performing photolithography at least once.

Figure 6B:
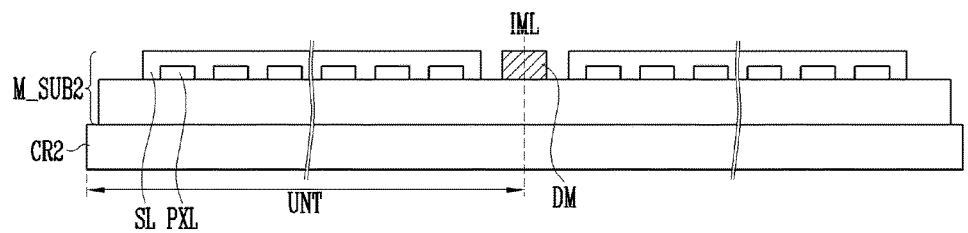

Referring to FIG. 6B, the second mother substrate M_SUB2 is prepared. On a rear surface of the second mother substrate M_SUB2, a second carrier substrate CR2 is provided to support the second mother substrate M_SUB2. The second mother substrate M_SUB2 and the second carrier substrate CR2 too are in contact with each other, as they are attached to each other by static electricity, the Van der Waals' force, and/or the like.

The second mother substrate M_SUB2 includes a plurality of unit areas UNT as well. The unit area UNT is the portion that corresponds to each display device. In every unit area UNT, a second substrate SUB2 of each display device is formed. The unit area UNT of the second mother substrate M_SUB2 is substantially the same as the unit area UNT of the first mother substrate M_SUB1 and thus repeated explanation is omitted.

The second mother substrate M_SUB2 may be prepared by forming pixels PXL, a sealing layer SL, signal lines SGL, an operation pad portion OP, and a connection pad portion CP on the second base substrate BS2. The pixels PXL may be formed through various suitable processes, for example, by performing a laminating process and/or photolithography for a plurality of times.

In this case, at least a portion of the pixel portion PX and at least a portion of the dummy portion DM may be prepared by the same process, and thus with the same or substantially the same material as well.

For example, the dummy buffer layer BFL' may be prepared on the second base substrate BS2 at the same step as the buffer layer BFL of the pixel portion PX. The dummy first insulating layer INS1', the dummy second insulating layer INS2', and the dummy third insulating layer INS3' may be prepared on the dummy buffer layer BFL' at the same step as the first insulating layer INS1, the second insulating layer INS2, and the third insulating layer INS3 of the pixel portion PX, respectively. The dummy pixel defining layer PDL' may be formed on the dummy third insulating layer INS3' at the same step as the pixel defining layer PDL of the pixel portion PX. The dummy second electrode EL2' may be prepared on the dummy pixel defining layer PDL' at the same step as the second electrode EL2' of the pixel portion PX. The dummy sealing layer SL' may be prepared on the dummy second electrode EL2' at the same step as the sealing layer SL of the pixel portion PX.

In an embodiment of the present disclosure, at least some of the layers constituting the dummy portion DM may be formed at the same step as at least some of the layers corresponding to the pixel portion PX, but not every layer of the dummy portion DM is formed at the same step as the layers corresponding to the pixel portion PX. For example, the dummy first insulating layer INS1' to the dummy third insulating layer INS3' of the dummy portion DM may be formed at the same step as the first to the third insulating layers INS1, INS2, and INS3 of the pixel portion PX; however, the dummy pixel defining layer PDL' of the dummy portion DM may be formed at a step different from that of the pixel defining layer PDL of the pixel portion PX.

In an embodiment of the present disclosure, the layers constituting the dummy portion DM are not limited to those illustrated in the drawings. That is, some of the layers constituting the dummy portion DM may be omitted.

In an embodiment of the present disclosure, the dummy portion DM is arranged to overlap the imaginary line IML in a plan view. That is, the imaginary line IML is placed on the dummy portion DM. In a plan view, the dummy portion DM may extend along the imaginary line IML. In a plan view, the imaginary line IML may be located within the dummy portion DM area, and not to meet the line at the edge of the dummy portion DM as much as possible. The imaginary line IML is arranged on a position that divides the dummy portion DM into two, in a plan view. One side and the other side of the dummy portion DM divided by the imaginary line IML are each within each of unit areas UNT adjacent to each other.

Figure 6C:
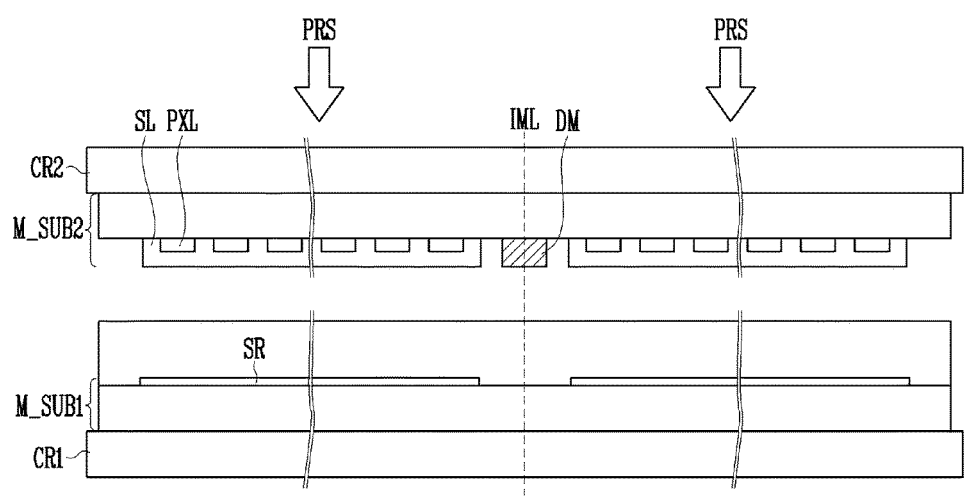

Referring to FIG. 6C, the first mother substrate M_SUB1 and the second mother substrate M_SUB2 are bonded to each other with the interlayer CTL arranged therebetween. The first mother substrate M_SUB1 and the second mother substrate M_SUB2 are bonded to each other after they are arranged such that their imaginary lines IML correspond to each other in a plan view.

At the bonding process, the first mother substrate M_SUB1 and the second mother substrate M_SUB2 are compressed in a direction facing each other (e.g., vertical direction in the drawings). The compressing may be performed from top to bottom, that is, by applying pressure from the first mother substrate M_SUB1 towards the second mother substrate M_SUB2. In an embodiment of the present disclosure, it is illustrated that the first mother substrate M_SUB1 is located on an upper portion, but there is no limitation thereto, and thus in another embodiment of the present disclosure, the second mother substrate M_SUB2 may be located on the upper portion instead. In such a case, the compression may be made by applying pressure from the second mother substrate M_SUB2 towards the first mother substrate M_SUB1.

The interlayer CTL may be formed on the first mother substrate M_SUB1 in various suitable ways including the printing method, coating method, and dispensing method. For example, the interlayer CTL may be formed by one the printing methods such as screen printing, inkjet printing, nozzle printing, and/or the like; coating methods such as slit coating, spin coating, spray coating, and/or the like; and the dispensing method of using a dispenser. In an embodiment of the present disclosure, in the case of forming the interlayer CTL in the screen printing method, it is possible to print the interlayer in a surface shape.

In an embodiment of the present disclosure, the interlayer CTL is provided on the second substrate SUB2 with the interlayer CTL uncured. Then the interlayer CTL is semi-cured once it is provided on the second substrate SUB2. The semi-curing process is performed to make the interlayer CTL have an adequate elasticity and liquidity. The semi-curing process may be performed by thermo-curing or photo-curing.

In an embodiment of the present disclosure, the interlayer CTL is made of an uncured or semi-cured material, and thus has a certain degree of liquidity. The interlayer CTL is cured in earnest with the first mother substrate M_SUB1 and the second mother substrate M_SUB2 bonded to each other with the interlayer CTL arranged therebetween. This main curing process may be performed by thermo-curing using heat or by photo-curing using light, such as UV and/or the like.

The interlayer CTL is completely cured in this curing process, and the first mother substrate M_SUB1 and the second mother substrate M_SUB2 are firmly bonded to each other.

In an embodiment of the present disclosure, it is illustrated that the interlayer CTL is formed on the first mother substrate M_SUB1, but without being limited thereto. In another embodiment of the present disclosure, the interlayer CTL may be formed on the second mother substrate M_SUB2 instead.

Figure 6D:
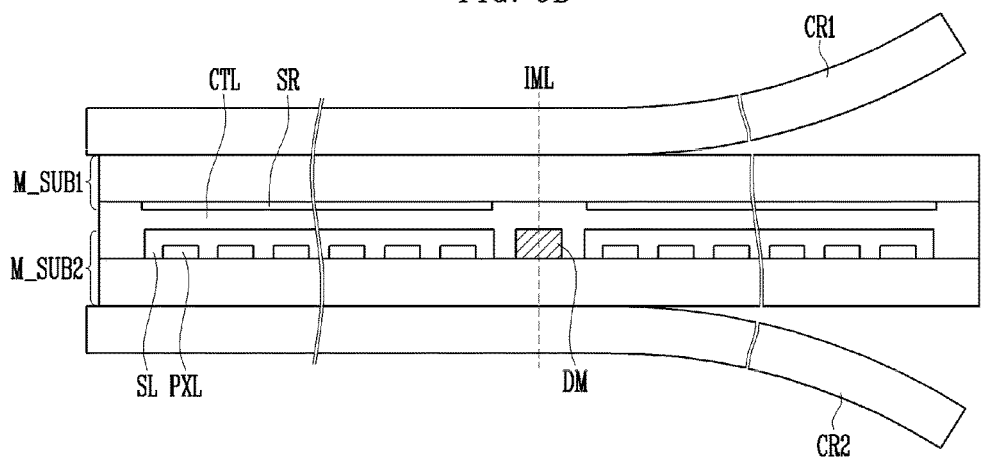

Referring to FIG. 6D, the first carrier substrate CR1 and the second carrier substrate CR2 are removed. The first carrier substrate CR1 is separated from the first mother substrate M_SUB1 and the second carrier substrate CR2 is separated from the second mother substrate M_SUB2.

Figure 6E:
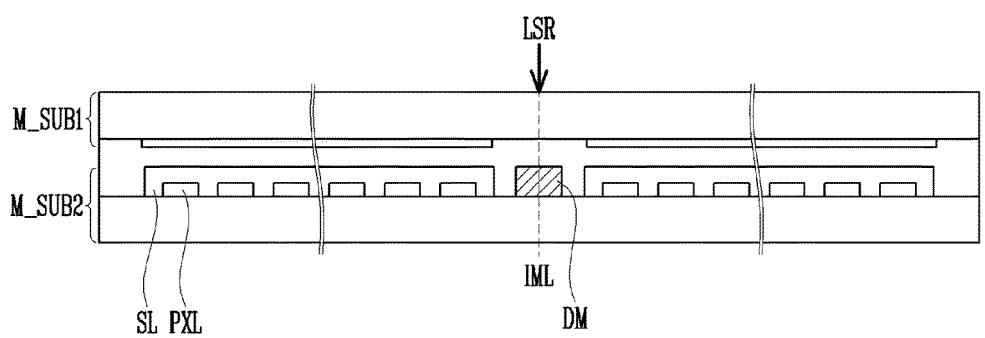

Referring to FIG. 6E, the bonded first mother substrate M_SUB1 and the second mother substrate M_SUB2 are cut per unit area UNT. The cutting is performed along the imaginary line IML. Each line of each unit area UNIT cut along the imaginary line IML may correspond to the first to the fourth lines S1, S2, S3, and S4 of the final unit.

Cutting the first to the second mother substrate M_SUB1 and M_SUB2 may be performed in various suitable methods. For example, the cutting may be performed using a scribing wheel, a laser, and/or the like. Two unit areas UNT adjacent to each other are divided by the imaginary line IML, and on the line cut along the imaginary line IML, the dummy portion DM and the interlayer are exposed to the outside.

Figure 6F:
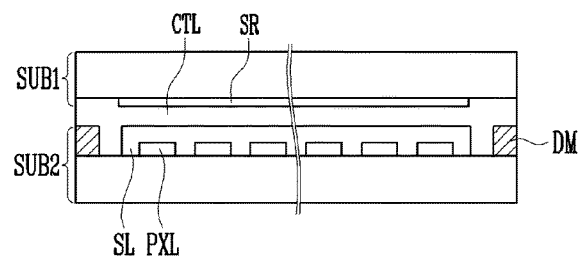

Referring to FIG. 6F, a display device is completed by the cut unit area. FIG. 6F illustrates an example of a display device cut by laser. The dummy portion DM is formed on both sides. In this case, as the interlayer CTL and the dummy portion DM are cut across along the imaginary line IML, a side of the interlayer CTL and the dummy portion DM are exposed to the outside.

The display device prepared in the above method has the following effects.

The dummy portion DM according to an embodiment of the present disclosure prevents or substantially prevents defects from occurring when cutting a unit area UNT. In a conventional display device, a pixel portion PX is provided only in a display area DA and not in a non-display area NDA, and thus a level difference occurs between the display area DA and the non-display area NDA. When the first mother substrate M_SUB1 and the second mother substrate M_SUB2 are bonded after forming the interlayer CTL on the first mother substrate M_SUM1, due to the level difference between the display area DA and the non-display area NDA, the gap between the first mother substrate M_SUB1 and the second mother substrate M_SUB2 in the non-display area NDA may be greater than the gap between the first mother substrate M_SUB1 and the second mother substrate M_SUB2 in the display area DA. When the interlayer CTL is formed in substantially a consistent thickness on the first mother substrate M_SUB1, the interlayer CTL may be filled sufficiently in the display area DA; however, there may be an unfilled portion in the non-display area NDA due to the greater filling space compared to the display area DA. The unfilled portion will be shown bubbles. The bubbles will not only reduce the adhesion between the first mother substrate M_SUB1 and the second mother substrate M_SUB2, but also make the cross-sections of the first and the second substrates SUB1 and SUB2 formed by cutting the first and the second mother substrate M_SUB1 and M_SUB2 rather rough. For example, in the case of cutting the first and the second mother substrate M_SUB1 and M_SUB2 by laser, the laser may be scattered in the bubbles, thereby using more area than the actual area to be cut, which is not desirable.

In an embodiment of the present embodiment, by forming the dummy portion DM, the level difference between the display area DA and the non-display area NDA is reduced. Accordingly, the adhesion between the first substrate SUB1 and the second substrate SUB2 increases. Furthermore, due to the reduced level of difference, bubbles will be reduced or prevented from being generated, making it possible to maintain a uniform cutting cross-section of the first and the second mother substrate M_SUB1 and M_SUB2. This also prevents or substantially prevents the laser from being scattered by the bubbles, thereby improving the cutting margin.

Moreover, because the dummy portion DM is provided along the cutting line, the dummy portion DM reduces or prevents any crack generated in each substrate during the process of cutting the first mother substrate M_SUB1 and the second mother substrate M_SUB2 from spreading to the pixel portion PX. Furthermore, the dummy portion DM reduces or prevents elements such as moisture, oxygen, and/or the like from entering the inside of the pixel portion PX. This is because the dummy portion DM is formed to be spaced apart from the pixel portion PX. Because there is the interlayer CTL between the pixel portion PX and the dummy portion DM, the interlayer CTL may prevent or substantially prevent the stress generated during the cutting of the first and the second mother substrate M_SUB1 and M_SUB2 from being transmitted to the pixel portion PX, and also prevent elements such as moisture, oxygen, and/or the like from entering along interfaces of each layer laminated on the dummy portion DM.

Figure 7A:
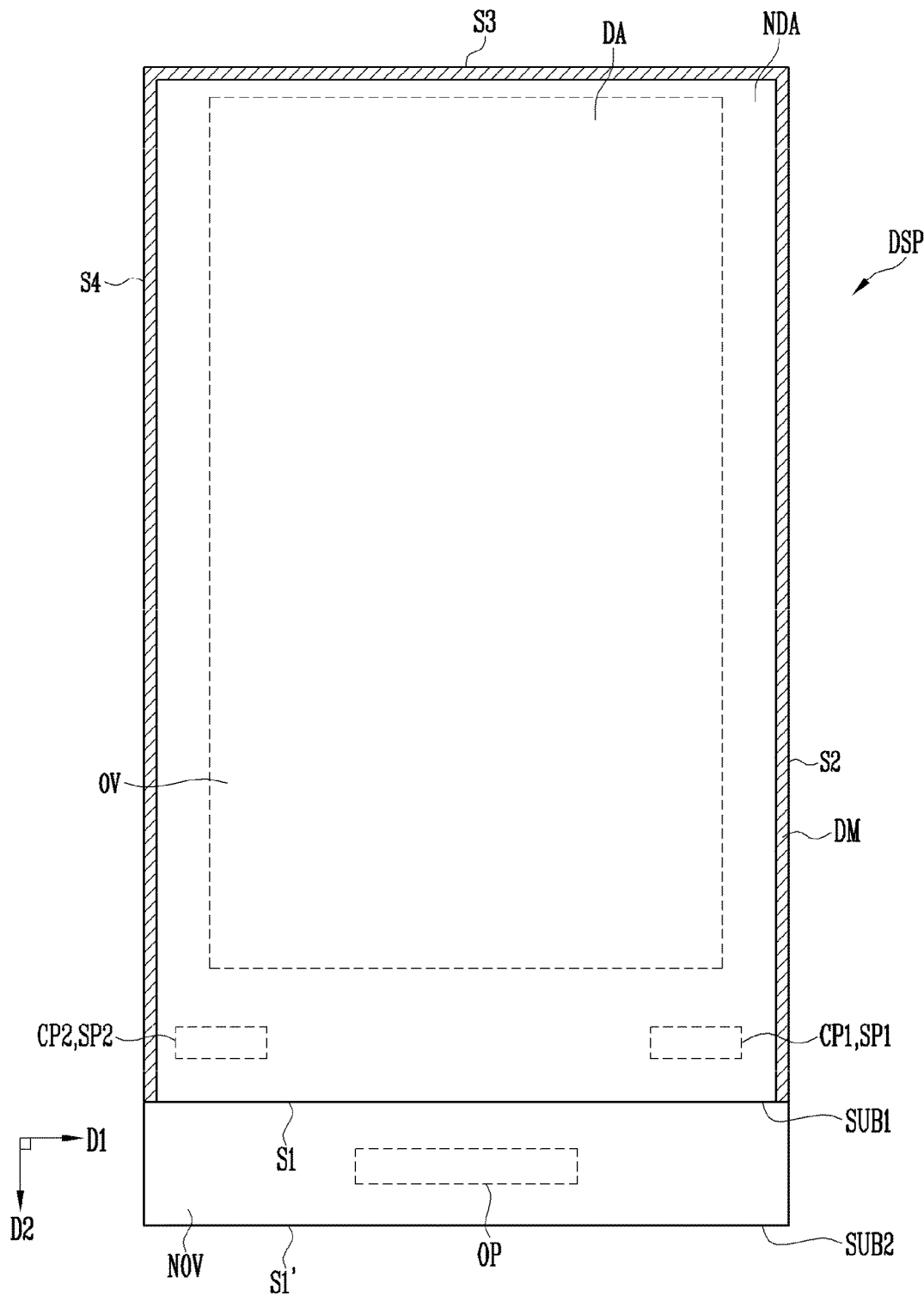
FIGS. 7A and 7B are plan views illustrating display devices according to embodiments of the present disclosure.
Figure 7B:
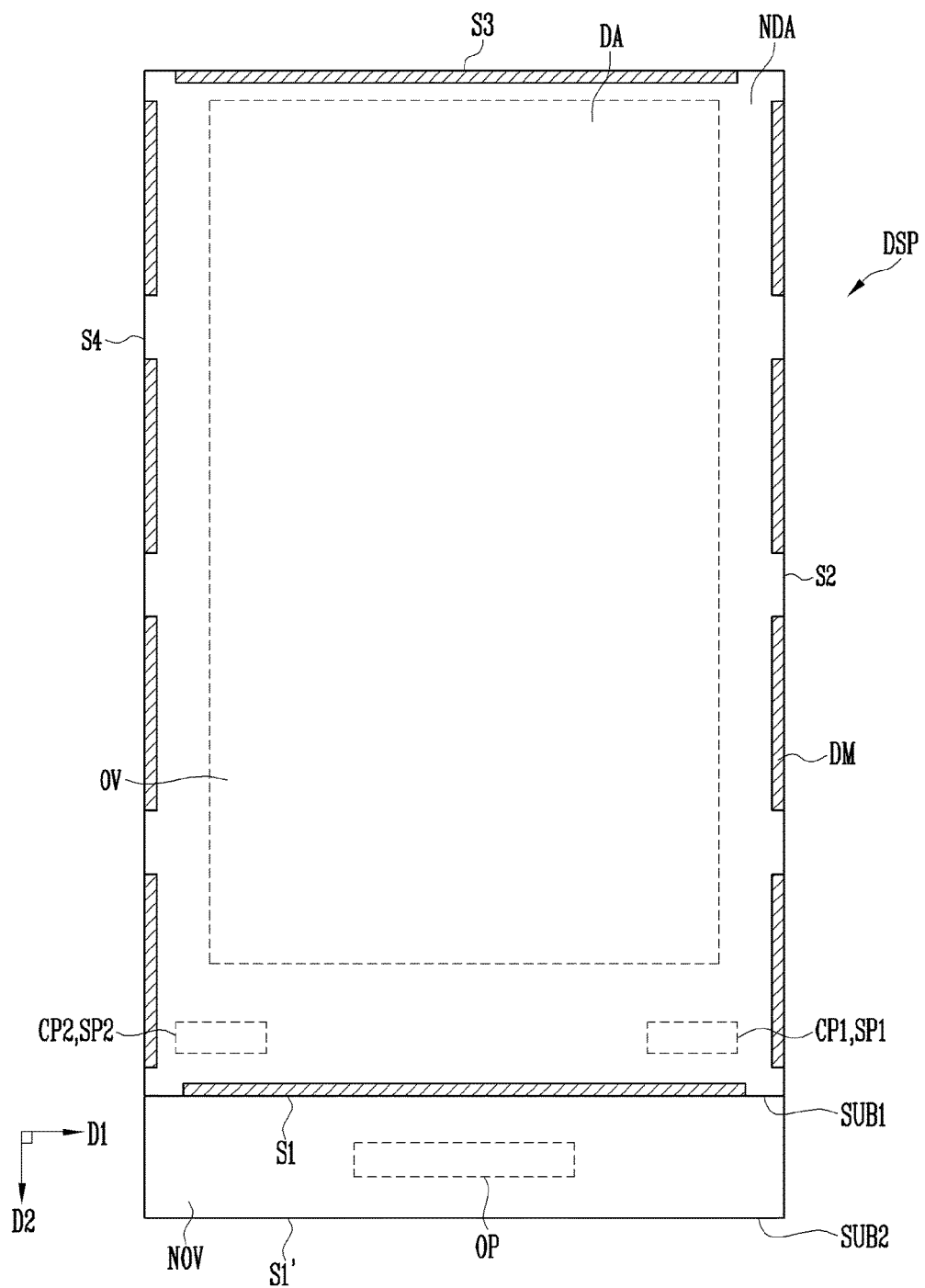

FIGS. 7A and 7B are plan views illustrating embodiments of the present disclosure.

Referring to FIGS. 7A and 7B, the dummy portion DM may have various suitable shapes as long as it is within the range to obtain the effects according to the aforementioned embodiments.

Referring to FIG. 7A, the dummy portion DM may cover a portion of the display area DA. In the present embodiment, the dummy portion DM may be provided along the second to the fourth lines S2, S3, and S4 excluding the first line S1 of the first substrate SUB1. Furthermore, the dummy portion DM may be formed along only one of the first to the fourth lines S1, S2, S3, and S4, or along only two of the first to the fourth lines S1, S2, S3, and S4. The area on which the dummy portion DM is to be formed may be set differently depending on the size of a mother substrate and the shape of a unit area arranged within the mother substrate.

Referring to FIG. 7B, the dummy portion DM may be provided to cover a portion of the display area DA in a plan view, and in the form of a plurality of bars that extend along the periphery (e.g., circumference) of the first substrate SUB1.

Example embodiments have been disclosed herein, and although specific terms are employed, they are sued and are to be interpreted in a generic and descriptive sense only and not for purpose of limitation. In some instances, as would be apparent to one of ordinary skill in the art as the filing of the present application, features, characteristics and/or elements described in connection with a particular embodiment may be used singly or in combination with features, characteristics, and/or elements described in connection with other embodiments unless otherwise specifically indicated.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Accordingly, it will be understood by those of skill in the art that various suitable changes in form and details may be made without departing from the spirit and scope of the present invention as set forth in the following claims and equivalents thereof.

What is claimed is:

1. A display device comprising:
   a first substrate;
   a second substrate comprising a pixel portion configured to display an image, and a dummy portion spaced from the pixel portion, a side of the dummy portion being exposed to the outside; and
   an interlayer between the first substrate and both of the pixel and dummy portions of the second substrate,
   wherein the pixel portion and the dummy portion each comprise multiple layers, and at least one layer of the pixel portion and at least one layer of the dummy portion comprise a same material, the multiple layers of the dummy portion comprising a dummy sealing layer, a dummy insulating layer, and a dummy electrode layer between the dummy sealing layer and the dummy insulating layer,
   wherein the second substrate further has a region on an upper surface of the second substrate defined by a spacing between the pixel portion and the dummy portion,
   wherein the upper surface of the second substrate is exposed in the region of the second substrate,
   wherein the interlayer is between the first substrate and the upper surface of the second substrate exposed in the region, and
   wherein the upper surface of the second substrate exposed in the region is in direct contact with the interlayer.

2. The display device of claim 1, wherein a portion of an edge of the second substrate and a portion of an edge of the dummy portion are aligned in a plan view.

3. The display device of claim 2, wherein the display device has a circular, an oval, or a polygonal shape, and the dummy portion is arranged along at least a portion of lines of the circular, the oval, or the polygonal shape.

4. The display device of claim 3, wherein a portion of a side of the interlayer is exposed to the outside.

5. The display device of claim 1, wherein the pixel portion comprises at least one pixel, and a sealing layer on the pixel to cover the pixel.

6. The display device of claim 5, wherein the dummy sealing layer comprises a same material as the sealing layer.

7. The display device of claim 6, wherein the sealing layer comprises multiple layers comprising an organic insulating layer and an inorganic insulating layer.

8. The display device of claim 7, wherein at least one of the organic insulating layer and the inorganic insulating layer are provided in plural, and the organic and inorganic insulating layers are arranged alternately to each other.

9. The display device of claim 5,
   wherein the pixel comprises multiple layers, and
   wherein the dummy portion comprises a same material as at least one of the multiple layers of the pixel.

10. The display device of claim 1,
    wherein the display device comprises a display area configured to display the image and a non-display area at a periphery of the display area, and
    wherein the pixel portion is at the display area.

11. The display device of claim 10, wherein the dummy portion is at the non-display area, and is spaced from the pixel portion.

12. The display device of claim 11, wherein the dummy portion covers the display area in a plan view.

13. The display device of claim 11, wherein the dummy portion covers a portion of the display area in a plan view.

14. The display device of claim 13, wherein the dummy portion comprises a plurality of bars extending along a circumference of the first substrate.

15. The display device of claim 1, wherein the second substrate comprises a second base substrate on which the pixel portion and the dummy portion are formed, and the interlayer is filled between the dummy portion and the pixel portion.

16. The display device of claim 1, further comprising a touch sensor between the first substrate and the interlayer.

17. The display device of claim 1, wherein an entire exposed surface of the second substrate is in contact with the interlayer at the region between the pixel portion and the dummy portion.

18. A display device comprising:
    a first substrate;
    a second substrate comprising a pixel portion configured to display an image, and a dummy portion spaced from the pixel portion; and
    an interlayer between the first substrate and both of the pixel and dummy portions of the second substrate,
    wherein the pixel portion and the dummy portion each comprise multiple layers, and at least a portion of the pixel portion and at least a portion of the dummy portion are formed by a same process, the multiple layers of the dummy portion comprising a dummy sealing layer, a dummy insulating layer, and a dummy electrode layer between the dummy sealing layer and the dummy insulating layer,
    wherein the second substrate further has a region on an upper surface of the second substrate defined by a spacing between the pixel portion and the dummy portion, wherein the upper surface of the second substrate is exposed in the region of the second substrate, wherein the interlayer is between the first substrate and the upper surface of the second substrate exposed in the region, and wherein the upper surface of the second substrate exposed in the region is in direct contact with the interlayer.

19. The display device of claim 18, wherein an entire exposed surface of the second substrate is in contact with the interlayer at the region between the pixel portion and the dummy portion.

* * * * *